United States Patent [19]

Harada et al.

[11] Patent Number: 5,183,647
[45] Date of Patent: * Feb. 2, 1993

[54] METHOD FOR PURIFYING NITROGEN TRIFLUORIDE GAS

[75] Inventors: Isao Harada; Hisashi Hokonohara; Toshiaki Yamaguchi, all of Yamaguchi, Japan

[73] Assignee: Mitsui Toatsu Chemicals, Inc., Tokyo, Japan

[*] Notice: The portion of the term of this patent subsequent to Aug. 14, 2007 has been disclaimed.

[21] Appl. No.: 689,941

[22] PCT Filed: Oct. 9, 1989

[86] PCT No.: PCT/JP89/01038
§ 371 Date: May 28, 1991
§ 102(e) Date: May 28, 1991

[87] PCT Pub. No.: WO91/04942
PCT Pub. Date: Apr. 18, 1991

[51] Int. Cl.$^5$ .............................................. C01B 9/08
[52] U.S. Cl. ..................................... 423/239; 423/235
[58] Field of Search ............... 423/235 R, 239 R, 406

[56] References Cited

U.S. PATENT DOCUMENTS

| | | | |
|---|---|---|---|
| 4,193,976 | 3/1980 | Lileck et al. | 423/406 |
| 4,543,242 | 9/1985 | Aramaki et al. | 423/406 |
| 4,804,447 | 2/1989 | Sartori | 204/63 |
| 4,933,158 | 6/1990 | Aritsuka et al. | 423/210 |
| 4,948,571 | 8/1990 | Harada et al. | 423/406 |
| 4,960,581 | 10/1990 | Harada et al. | 423/489 |
| 4,975,259 | 12/1990 | Hyakutake et al. | 423/406 |
| 4,980,144 | 12/1990 | Koto et al. | 423/406 |
| 5,084,156 | 1/1992 | Iwanaga et al. | 204/243 |

*Primary Examiner*—Wayne Langel
*Assistant Examiner*—Stuart L. Hendrickson
*Attorney, Agent, or Firm*—Fisher, Christen & Sabol

[57] ABSTRACT

$NF_3$ gas containing $N_2F_2$ as an impurity is purified by heating said $NF_3$ gas at specified temperatures in a vessel the inner wall of which is coated with a strong and passive film of nickel flouride. According to this method, the rate of $NF_3$ loss is low and the rate of removing $N_2F_2$ is high. Therefore, when the $NF_3$ gas thus purified is further purified with a known adsorbent, a highly pure $NF_3$ gas can be easily and safely produced which is suitable for materials for semiconductor dry etching agents and the like.

14 Claims, No Drawings

METHOD FOR PURIFYING NITROGEN TRIFLUORIDE GAS

TECHNICAL FIELD

The present invention relates to a method for purifying nitrogen trifluoride gas, and more particularly, to a method for removing, in particular dinitrogen difluoride from nitrogen trifluoride gas.

BACKGROUND ART

Nitrogen trifluoride ($NF_3$) gas has recently drawn attention as a dry etching agent for semiconductors and a cleaning gas for CVD apparatuses, and nitrogen trifluoride gas used for these purposes is required to be as highly pure as possible.

Nitrogen fluoride ($NF_3$) gas may be produced by various methods, but nitrogen fluoride gas produced by any method mostly contains impurities such as nitrous oxide ($N_2O$), carbon dioxide ($CO_2$), dinitrogen difluoride ($N_2F_2$) and the like in a relatively large amount. Therefore, it is required to purify the $NF_3$ gas so as to obtain a highly pure $NF_3$ gas usable for the above-mentioned purposes.

As a method for purifying $NF_3$ gas by removing these impurities, a method which comprises adsorbing and removing the impurities by means of an adsorbent such as zeolite and the like is known as one of the most efficient and simplest methods [Chem. Eng., 84,116 (1977), etc.]. However, when $N_2F_2$ is present in the $NF_3$ gas, the purification method by adsorption suffers the following drawbacks.

That is,

1) When $N_2F_2$ is present, the adsorption ability of the other impurities such as $CO_2$, $N_2O$ and the like is extremely lowered.

2) When $N_2F_2$ is present, $NF_3$ is liable to be adsorbed to the adsorbent resulting in a loss of $NF_3$ gas.

3) $N_2F_2$ adsorbed to the adsorbent and thereby concentrated is liable to decompose and generate heat, and in an extreme case, an explosion is caused.

Therefore, when impurities in $NF_3$ gas are to be removed by using an adsorbent such as zeolite and the like, it is necessary to remove $N_2F_2$ in advance.

As a method for removing $N_2F_2$ contained in $NF_3$ gas, a method is known which comprises reacting $N_2F_2$ with an aqueous solution of KI, HI, $Na_2S$, $Na_2S_2O_4$, $Na_2SO_3$ or the like in a reaction vessel [J. Massonne, Chem. Ing. Techn., 41, (12), 695 (1969)]. However, according to this method, it takes a relatively long time to remove $N_2F_2$ completely and therefore the reaction vessel must be considerably large and a large amount of chemicals is also necessary.

As another known method for removing $N_2F_2$, $NF_3$ gas containing $N_2F_2$ is passed through a catalyst packed bed formed by packing a reaction vessel with metal pieces or nets which has a sufficient reactivity capable of defluorinating $N_2F_2$ such as heated stainless steel, carbon steel, copper, aluminum, zinc, lead, nickel, iron and the like, and thereby, when the $NF_3$ gas is brought into contact with the metal pieces or net as a catalyst, the $N_2F_2$ is decomposed on the surface of the metal pieces or net (U.S. Pat. No. 4,193,976). However, according to the present inventors' investigation, this method is liable to form metal fluorides on the surface of the metal pieces or net due to the reaction of the metal pieces with $N_2F_2$. And the resulting metal fluorides are very fragile, are easily peeled off from the surface of the metal pieces and powdered. As a result, there is a drawback their that the powder clogs the packed bed and pipes and the like of the purification apparatus.

According to our investigation, when nickel is used as the metal pieces, the fluoride film is formed on the surface of the nickel pieces, but after the surfaces of the nickel pieces have become covered with the fluoride film, there is no exposed nickel metal surface remaining for the reaction with $N_2F_2$ so that the nickel pieces naturally have lost the catalytic activity. Therefore, it is necessary to stop the operation periodically and substitute new nickel pieces for the old ones so as to newly pack the catalyst bed. Therefore, the operation is very complicated and moreover, nickel is expensive, and therefore, in combination, the operation cost is disadvantageously high.

In addition, according to the present inventors' investigation, when the heating temperature of the packed bed composed of metal pieces is elevated so as to enhance the rate of the removal of $N_2F_2$, the main component $NF_3$ also reacts with the metal pieces at temperatures of 200° C. or higher to decompose and the yield of $NF_3$ is decreased to a great extent corresponding to the degree of decomposition.

The present inventors have diligently researched for a method for removing $N_2F_2$ contained in $NF_3$ gas and surprisingly found that $N_2F_2$ is efficiently decomposed into nitrogen ($N_2$) gas and fluorine ($F_2$) gas by only heating the $NF_3$ gas containing $N_2F_2$ to specified temperatures without bringing the gas into contact with any metal surface. When the above-mentioned heating is effected in a specified vessel the wall surface of which is covered with a passive film, there is the advantage that the main component, $NF_3$, of the gas is not substantially decomposed even if the gas is heated to a temperature of 200° C. or higher.

In addition, the present inventors have also found that when a solid fluoride is packed in the above-mentioned vessel, the $N_2F_2$ is more efficiently subjected to decomposition and therefore, only $N_2F_2$ in $NF_3$ gas can be effectively removed.

The present invention has been completed based on the above-mentioned new knowledge found by the present inventors.

DISCLOSURE OF INVENTION

According to one aspect of the present invention, there is provided a method for purifying nitrogen trifluoride gas containing at least dinitrogen difluoride as impurities which comprises:

a. providing a vessel at least the inner wall of which is composed of nickel for heating the nitrogen trifluoride gas b. forming previously a strong film of nickel fluoride by bringing at least fluorine gas into contact with the inner wall of the vessel, and c. heating the nitrogen trifluoride gas at 150°-600° C. in the vessel, the inner wall of which is covered with the nickel fluoride film.

According to another aspect of the present invention, there is provided a method for purifying nitrogen trifluoride gas containing at least dinitrogen difluoride as impurities which comprises:

a. providing a vessel at least the inner wall of which is composed of nickel for heating the nitrogen trifluoride, b. forming previously a strong film of nickel fluoride by bringing at least fluorine gas into contact with the inner wall of the vessel, c. packing with a solid fluoride the vessel, the inner wall of which is covered with the nickel fluoride film, to form a packed bed, and d. heating the nitrogen trifluoride gas in the packed bed at 150°–600° C.

According to the present invention, there is firstly prepared a vessel at least the inner wall of which is composed of nickel, for heating the nitrogen trifluoride gas, more exactly speaking, such vessel as above in which the nitrogen trifluoride gas is heated.

The shape of such vessel is not particularly limited, for example, any type such as box, agitator vessel, cylinder and the like may be used. For the purpose of continuously treating and efficiently heating the gas, a tubular or pipe type vessel is preferable.

Such tubular or pipe type vessel has a gas inlet and a gas outlet, and usually the inner diameter is about 5 mm–50 cm $\phi$ and the length is about 10 cm–300 cm.

The heating means is not particularly limited, but the following are preferable, that is, heating the vessel externally by an electric heater or a burner, or providing a jacket outside the pipe or preparing a double pipe and circulating a heating medium through the jacket or the space between the inner wall and the outer wall. Further, the gas may be fed after previously heating if desired. As a material for the vessel, there may be used a material at least the inner wall of which is composed of nickel and which is substantially made of nickel, or a material which is such that the inner wall of an iron vessel is plated with nickel.

According to the present invention, the inner wall of the vessel thus prepared is previously brought into contact with fluorine gas to form a strong and substantially passive nickel fluoride film.

The above-mentioned film is a great feature of the present invention. Such passive film of nickel fluoride may be produced by the following procedure.

First, the above-mentioned vessel is heated to about 30°–200° C., and at the heated state, $F_2$ gas or an $F_2$ gas diluted with an inert gas such as $N_2$ gas, helium (He) gas and the like is passed through the vessel for 10 min.–15 hours, preferably 30 min.–10 hours, to react nickel with $F_2$ gas to form a nickel fluoride film. Upon this reaction of nickel with $F_2$ gas, it is preferable that at first the reaction is effected with an $F_2$ gas of a low concentration diluted with an inert gas, then the concentration of $F_2$ gas is gradually or stepwise enhanced and finally, a 100 percent $F_2$ gas is used for the reaction.

According to the present invention, it is preferable that the nickel fluoride film thus formed is subjected to a post-heat treatment at 400°–800° C., preferably 600°–800° C., in an inert atmosphere such as nitrogen, helium, neon, argon, xenon and the like to form a stronger film. The exact mechanism of the film being strengthened is not clear, but it is presumed that the post-heat treatment heats and hardens the film and thereby the crystallinity of the film is enhanced etc. and as a result a substantially passive and strong film is formed.

An example of preferable procedure for this embodiment of the invention is concretely shown in the following.

First, a gas comprising about 20–30 percent $F_2$ and about 80–70 percent $N_2$ is passed through a nickel vessel to be treated at a flow rate of about 10–1000 cc/min. at temperatures of about 30°–200° C., preferably about 100°–150° C. for about 5 min.–5 hours, preferably about 1–2 hours.

Then, the concentration of fluorine gas is increased, that is, a gas comprising about 40–60 percent $F_2$ and about 60–40 percent $N_2$ is used, and the treatment with the gas is effected at a flow rate of about 10–1000 cc/min. at about 30°–200° C., preferably about 100°–150° C., for about 5 min.–5 hours, preferably about 1–2 hours.

Further, the concentration of fluorine gas is increased to 100 percent $F_2$ and the treatment is carried out at a flow rate of about 10–1000 cc/min. at about 30°–200° C., preferably about 100°–150° C. for about 5 min.–5 hours, preferably about 1–2 hours.

Finally, a post-heat treatment is effected by using $N_2$ or He gas at a flow rate of about 10–1000 cc/min. at about 400°–800° C., preferably about 600°–800° C. for about 1–6 hours, preferably about 3–5 hours.

The nickel fluoride film thus produced is determined to be substantially a passive film when a gas composed of 20 percent $F_2$ and 80 percent $N_2$ is fed to the vessel having the film at a flow rate of 10–1000 cc/min. and brought into contact with the film at 200° C., and the concentration of $F_2$ gas measured at the outlet is not different from that at the inlet.

A desirable thickness of the nickel fluoride is preferably 5–300 $\mu$m, more preferably 10–100 $\mu$m. When the thickness is thinner than this value, the film is less effective as a protective film and the strength is so weak that the film is easily broken. On the other hand, when the film is thicker than the value, strain is formed in the film and the film is liable to be cracked, and therefore, the thicker film is not preferred. The thickness of the film can be measured by cutting the vessel having the formed film and photographing the cross section by using an electron microscope, or by following the above procedure and measuring the distribution of fluorine by using an X-ray microanalyser.

According to the present invention, the nitrogen trifluoride gas is heated at 150°–600° C. in the vessel with an inner wall covered with a nickel fluoride film.

A nitrogen trifluoride gas to be treated by the present invention is that containing at least dinitrogen difluoride ($N_2F_2$) as an impurity, and other than $N_2F_2$, it may contain nitrous oxide ($N_2O$), carbon dioxide ($CO_2$) and the like.

The typical composition is approximately $N_2F_2$: 1–5%, $N_2O$: 1–10% and $CO_2$: 1–5%. It is demanded that at least the $N_2F_2$ content becomes 0.1–50 ppm, preferably 0.1–40 ppm, more preferably 0.1–30 ppm, the most preferably 0.1–10 ppm after the purification treatment. If the $N_2F_2$ content has been reduced to this range, the other impurities can be easily removed with adsorbents or the like.

According to the present invention, the $NF_3$ gas containing $N_2F_2$ as an impurity is heated at 150°–600° C., preferably 250°–350° C. When the heating temperature is lower than 150° C., $N_2F_2$ is hardly decomposed and thereby can not be removed. On the contrary, when the heating temperature exceeds 600° C. $N_2F_2$ can be almost completely removed, but there is concern that the nickel fluoride film will be peeled off due to the difference in the coefficient of thermal expansion, and moreover it results in loss of heat energy. At the above-mentioned heating temperature, the decomposition speed of $N_2F_2$ is very quick and thereby the residence time (a ratio of the volume of reaction vessel to the volume speed of the gas) of the passing $NF_3$ gas in the reaction vessel may be short, and it is usually about 5-1000 sec.

According to the present invention, the $NF_3$ gas passing through the above-mentioned vessel may be fed alone, or in a diluted form, that is, diluted with an inert gas such as $N_2$, He and the like. The pressure of the passing gas is not particularly limited, but usually a pressure of 0-5 kg/cm$^2$-G is preferable since it is convenient for operation.

According to the present invention, it is preferable that the coating on the inner wall of the above-mentioned vessel is preferably made of a strong nickel fluoride previously formed under particular conditions.

When an inner wall of a vessel made of a metal other than nickel such as iron, stainless steel, aluminum and the like is reacted with fluorine to form a metal fluoride film coating, the coating is often peeled off easily by heating and thereby the metal surface is exposed since the coating is weak and the adhesive strength to the metal wall surface is low.

Therefore, the coating can not function as a strong passive film. In addition, the exposed metal surface reacts with $NF_3$ to form a fragile film of a metal fluoride again, and the metal fluoride film is peeled off again, and the metal surface is exposed again and further reacts with $NF_3$. In this manner, the decomposition reaction of $NF_3$ proceeds as a chain-reaction, and as a result, $NF_3$ is lost to a great extent.

In addition, for the worse, the peeled film easily becomes fine particles and entrained to the following step by the discharging gas and thereby the fine particles clog the subsequent line such as a purification apparatus, pipes and the like, and finally the operation is forced to stop.

It should be noted that if nickel is used as a material for the vessel under conditions other than those defined in the present invention, the nickel fluoride film thus formed is very weak and the adhesive strength is also low, and thereby the film is easily peeled off and broken resulting in causing the same problems as in the case of iron and stainless steel vessels as mentioned above.

Furthermore, such metal vessels including the nickel vessel are gradually consumed due to their reaction with $N_2F_2$ etc. and the vessel wall gets thinner and thinner, and finally holes are formed in the vessel wall and the vessel can not be used anymore.

According to the present invention, a vessel with an inner wall covered with a nickel fluoride film may be used as an empty vessel, but preferably the vessel is packed with a solid fluoride to form a packed bed and nitrogen trifluoride gas is heated to 150°-600° C. in the packed bed. The packed bed serves to heat effectively and thereby the rate of removing $N_2F_2$ is further improved.

The solid fluorides which can be used as packing in the present invention are those incapable of reacting with $NF_3$ and have a melting point of 600° C. or higher. However, even if the melting point is lower than 600° C., the solid fluoride may be used in the present invention as far as it is solid at a temperature at which the $NF_3$ is heated.

Examples of such solid fluorides include fluorides of metals of Group IA of the Periodic Table such as lithium fluoride (LiF), sodium fluoride (NaF), calcium fluoride (KF), rubidium fluoride (RbF), cesium fluoride (CsF) and the like; fluorides of metals of Group IIA of the Periodic Table such as beryllium fluoride ($BeF_2$), magnesium fluoride ($MgF_2$), calcium fluoride ($CaF_2$), strontium fluoride ($SrF_2$), barium fluoride ($BaF_2$) and the like; fluorides of metals of Group IIIA of the Periodic Table such as aluminum fluoride ($AlF_3$), gallium fluoride ($GaF_3$), indium fluoride ($InF_3$) and the like; and double salts such as aluminum sodium fluoride ($Na_3AlF_6$) and the like. A mixture of these compounds may be used.

The shape of the solid fluoride is preferably particle, and the size of the particle is not particularly limited, but is determined depending on the size of the reactor and easiness of handling. It is also possible that a solid fluoride lump can be ground to form particles of an appropriate size such as about 10-50 mesh and then used. When a solid fluoride is in the form of powder, it is preferably shaped into a cylinder, ring, sphere, pill, plate form and then used. In the case of a cylinder, the size is usually about 10-30 mm in diameter and about 10-30 mm high, and in the case of a ring, the size is about 10-30 mm in outer diameter and about 5-25 mm in inner diameter.

Further, powder as a material for shaping is preferably about 1-20 μm in size. The method for shaping into a desired shape is not particularly limited, but the following method is preferable. First, a metal fluoride powder is sufficiently mixed with a shaping auxiliary agent such as stearic acid and the like in an amount of about 1-10 percent by weight. The resulting mixture is placed in a tableting machine and shaped at a tableting pressure of about 0.5-10 t/cm$^2$. The resulting shaped matters are heated at 600°-800° C. in an inert atmosphere such as nitrogen, argon, helium and the like to harden by heating. As a result, packings suitable for being packed in the vessel are obtained.

For the packing, small metal nickel pieces of about 1-30 mm in size having a strong nickel fluoride film on the surface can be used as an equivalent to the above-mentioned solid metal fluoride shaped matter. The nickel fluoride film can be produced by bringing the metal nickel pieces into contact with $F_2$ gas under the same conditions as those for forming a passive film of nickel fluoride on the wall surface of the vessel as mentioned above.

When the above-mentioned solid fluoride contains moisture, $NF_3$ reacts with the moisture upon the solid fluoride being brought into contact with the $NF_3$ gas, and nitrogen monoxide (NO) is formed so that it is desirable that the solid fluoride is previously dried to sufficiently remove any moisture.

The height of the packed bed composed of packings is not particularly limited, but is usually about 10-300 cm.

The size of the vessel, consequently, the dimensions of the packed bed, varies in proportion to the $NF_3$ gas volume to be treated, and therefore, usually the conditions are selected such that the gas linear speed is about 5-200 cm/min. and the contact time is about 2-100 sec. When the linear speed is too high, the contact time is too short to decompose $N_2F_2$ sufficiently. On the other hand, when the linear velocity is lower than the above-mentioned value, the contact time becomes unnecessarily long and the apparatus becomes also unnecessarily large.

According to another aspect of the present invention, an $NF_3$ gas to be purified is subjected to a heat decomposition treatment in the packed bed formed as above, but the heating temperature and other conditions are the same as those for the empty vessel as mentioned above in detail. That is, heating of the $NF_3$ gas is carried out at 150°–600° C., preferably 250°–350° C. At this heating temperature the decomposition speed of $N_2F_2$ in the packed bed is further increased and thereby, the contact time (residence time) of about 1–200 sec. is enough.

BEST MODE OF CARRYING OUT THE INVENTION

In the following, the present invention is further explained concretely by referring to Examples and Comparative Examples. In the Examples, Comparative Examples and Reference Examples, % and ppm are by volume.

EXAMPLES 1–3

While a nickel vessel (column) of 6 mm in inner diameter and 300 mm long was previously heated at 100° C., a 25% $F_2$ gas diluted with $N_2$ gas was passed through the vessel for one hour, then the concentration of $F_2$ gas was increased to 50% and the $F_2$ gas was passed for one hour, and furthermore a 100% $F_2$ gas was passed for one hour to treat the inner wall of the column by fluorination to form a nickel fluoride film.

In addition, the column was subjected to a post-heat treatment at 650° C. for 3.5 hours in a helium atmosphere. A test piece was cut out of the vessel and the cut cross-section surface was photographed by means of electron microscopy and the average value of the film thickness was about 60 μm.

An $NF_3$ gas containing $N_2F_2$ diluted with about the same volume of He gas was passed through the column under the conditions shown in Table 1. After passing through the column, the gas was bubbled through a 1% aqueous potassium iodide (KI) and led to a collecting bomb cooled with liquid nitrogen to liquefy $NF_3$ for collection. After stopping the passing of the $NF_3$ gas, the above-mentioned collecting bomb for $NF_3$ was vacuum-evacuated to remove He gas.

The composition of the $NF_3$ gas before passing the column and that after passing the column and in the collecting bomb were analyzed by gas chromatography. The result is shown in Table 1 that $N_2F_2$ was removed at a high removing rate and $NF_3$ was hardly lost.

Further, in Table 1 the content of $N_2$ gas after passing is higher than that before passing. This seems attributable to decomposition of $N_2F_2$ into $N_2$ and $F_2$ by heating.

COMPARISON EXAMPLES 1–4

A vessel (column) made of a material as shown in Table 2 (6 mm in inner diameter, 300 mm long) was not subjected to a fluorination treatment of the inner wall, but used directly, and $NF_3$ gas containing $N_2F_2$ diluted, as shown in Examples 1–3 above, with almost the same volume of He gas was passed through the column under the conditions as shown in Table 2.

After passing the column, the $NF_3$ gas was bubbled through a 1% aqueous KI as in Examples 1–3 and led to a collecting bomb cooled with liquid nitrogen as in Examples 1–3, to liquefy and collect the $NF_3$. After stopping the passing of the $NF_3$ gas, the collecting bomb was vacuum-evacuated to remove He.

The composition of the $NF_3$ gas before passing the column and that after passing the column and in the collecting bomb were analyzed by gas chromatography. The results are as shown in Table 2. It is shown that $N_2F_2$ was removed, but the yield of the important $NF_3$ was lowered to a great extent. That is, in the above Examples 1–3 the rate of $NF_3$ loss is as low as about 0.5% while in the Comparison Examples the rate of $NF_3$ loss is surprisingly very high, that is, 7.0–10%. This is a big problem.

In the same way, after continuous use for one week, the state of the inner wall of the reaction vessel was observed. And it was found that a brittle metal fluoride film formed on the inner wall was broken all over the inner wall and peeled off and the metal surface was severely damaged though the degree of damage varied somewhat depending on the type of metal such as iron, copper, stainless steel and nickel.

Therefore, the concern was that the pieces of the peeled film in a large amount that were conveyed by the gas and mixed with the down stream line would clog the line if the continuous operation was carried out anymore.

In addition, there was danger that the wall of the reaction vessel was further corroded and becoming thinner thus resulting in forming holes and blowing the gases therethrough, and therefore, any further continuous operation was given up.

TABLE 1

| | Example No. | | |
|---|---|---|---|
| | 1 | 2 | 3 |
| Gas passing conditions | | | |
| Gas passing temperature (°C.) | 170 | 300 | 600 |
| Flow rate of $NF_3$ gas diluted with He gas (Nml/min.) | 60 | 60 | 60 |
| Gas passing pressure (torr) | 760 | 760 | 760 |
| Gas passing time (h) | 4 | 4 | 4 |
| Before gas passing Gas analysis | | | |
| He (%) | 48.5 | 48.5 | 48.5 |
| $N_2$ (%) | 0.4 | 0.4 | 0.4 |
| $NF_3$ (%) | 48.2 | 48.2 | 48.2 |
| $N_2F_2$ (%) | 1.9 | 1.9 | 1.9 |
| $NF_3$ pure amount (g) | 20.1 | 20.1 | 20.1 |
| After gas passing Gas analysis | | | |
| $N_2$ (%) | 1.8 | 1.8 | 2.0 |
| $NF_3$ (%) | 96.2 | 96.4 | 96.6 |
| $N_2F_2$ (ppm) | 35 | 30 | 20 |
| $NF_3$ pure amount (g) | 20.0 | 20.0 | 20.0 |
| Rate of $NF_3$ loss (%) | 0.5 | 0.5 | 0.5 |

TABLE 2

| | Comparison Example No. | | | |
|---|---|---|---|---|
| | 1 | 2 | 3 | 4 |
| Gas passing conditions | | | | |
| Material of reaction tube | Iron | Copper | Stainless steel | Nickel |
| Gas passing temperature (°C.) | 300 | 300 | 300 | 300 |
| Flow rate of $NF_3$ gas diluted with He gas (Nml/min.) | 60 | 60 | 60 | 60 |
| Gas passing pressure (torr) | 760 | 760 | 760 | 760 |
| Gas passing time (h) | 4 | 4 | 4 | 4 |
| Before gas passing Gas analysis | | | | |
| He (%) | 48.5 | 48.5 | 48.5 | 48.5 |
| $N_2$ (%) | 0.4 | 0.4 | 0.4 | 0.4 |
| $NF_3$ (%) | 48.2 | 48.2 | 48.2 | 48.2 |
| $N_2F_2$ (%) | 1.9 | 1.9 | 1.9 | 1.9 |
| $NF_3$ pure amount (g) | 20.1 | 20.1 | 20.1 | 20.1 |
| After gas passing Gas analysis | | | | |
| $N_2$ (%) | 4.6 | 4.2 | 3.0 | 4.5 |
| $NF_3$ (%) | 94.1 | 94.4 | 95.0 | 95.5 |
| $N_2F_2$ (ppm) | 20 or less | 20 or less | 20 or less | 20 or less |
| $NF_3$ pure amount (g) | 18 | 18 | 18.5 | 18.7 |
| Rate of $NF_3$ loss (%) | 10 | 10 | 7.5 | 7.0 |

REFERENCE EXAMPLE 1

A stainless steel column of 10 mm in inner diameter and 300 mm long was packed with commercially available zeolite (pore size: 5 Å) (24–48 mesh particles) resulting in a packed bed of 250 mm thick, and the $NF_3$ gas, free of $N_2F_2$ prepared in Example 3 was passed through the zeolite layer. With respect to the gas passing conditions, the temperature was room temperature (about 20° C.), the flow rate of $NF_3$ gas 20 Nml/min., and the gas passing pressure 760 Torr.

After passing through the column, the composition of $NF_3$ gas was analyzed by gas chromatography. As a result, the contents of impurities were very low, that is, $N_2F_2$ 20 ppm or less, $N_2O$ 20 ppm or less, and $CO_2$ 20 ppm or less. Therefore, it is realized that when $NF_3$ gas from which $N_2F_2$ was previously removed according to the present invention is purified with a known adsorbent, impurities other than $N_2F_2$ such as $N_2O$, $CO_2$ and the like can be removed at a very high removing rate and a highly pure $NF_3$ can be obtained.

EXAMPLES 4–6

While a nickel vessel (column) of 6 mm in inner diameter and 300 mm long was previously heated at 100° C., a 25% $F_2$ gas diluted with $N_2$ gas was passed through the vessel for one hour, then the concentration of $F_2$ gas was increased to 50% and the $F_2$ gas was passed for one hour, and furthermore a 100% $F_2$ gas was passed for one hour to treat the inner wall of the column by fluorination to form a nickel fluoride film.

In addition, the column was subjected to a post-heat treatment at 650° C. for 3.5 hours in a helium atmosphere. According to the method as mentioned above, the average thickness was measured and it was 60 μm.

After that, the column was packed with particulate $CaF_2$ of 24–32 mesh (packed height, 250 mm), and $N_2$ gas was passed through the column at 200° C. at a flow rate of 100 cc/min. for one hour to remove moisture in the $CaF_2$.

Then, a $NF_3$ gas containing $N_2F_2$ diluted with almost the same volume of He gas was passed through the column packed with $CaF_2$ under the conditions as shown in Table 3.

The $NF_3$ gas after passing through the column was bubbled through a 1% by weight aqueous potassium iodide (KI) and then led to a collecting bomb cooled with liquid nitrogen to liquefy and collect the $NF_3$. After stopping the passing of the $NF_3$ gas, the above-mentioned collecting bomb for $NF_3$ was vacuum-evacuated to remove He gas.

The composition of the $NF_3$ gas before passing the column and that in the collecting bomb after passing the column were analyzed by gas chromatography. As a result, as shown in Table 3, $N_2F_2$ was removed at a high removing rate and loss of $NF_3$ was little.

Further, Table 3 shows that the content of $N_2$ after passing the column is more than that before passing the column. This phenomenon appears to be attributable to decomposition of $N_2F_2$ into $N_2$ and $F_2$ by heating.

EXAMPLES 7–9

The same column as that used in Examples 4–6, the inner wall of which was lined with nickel fluoride was packed with particulate solid fluoride having a particle size of 24–32 mesh as shown in Table 4 in place of calcium fluoride in the same volume as in Examples 4–6, and the solid fluoride was dried under the same conditions as in Examples 4–6 to remove moisture.

Then an $NF_3$ gas containing $N_2F_2$ diluted with substantially the same volume of He gas as that of the $NF_3$ gas was passed through the column under the conditions as shown in Table 4. After passing through the column, the gas was bubbled through a 1% by weight aqueous potassium iodide (KI) and then led to a collecting bomb cooled with liquid nitrogen to liquefy and collect the $NF_3$. After stopping the passing of the $NF_3$ gas, the collecting bomb for $NF_3$ was vacuum-evacuated to remove He gas.

The composition of the $NF_3$ gas before passing the column and that after passing the column were analyzed by gas chromatography. The result is shown in Table 4. $N_2F_2$ was removed at a high removing rate and loss of $NF_2$ was little.

The fact that the content of $N_2$ gas after passing the column is more than that before passing the column seems to be attributable to decomposition of $N_2F_2$ into $N_2$ and $F_2$ by heating.

COMPARISON EXAMPLES 5–8

The inner wall of a vessel (column) made of a material shown in Table 5 (6 mm in inner diameter, 300 mm long) was not fluorinated, but used directly, and the column was packed with metal particles of 24–32 mesh in size of NaF particles of 24–32 mesh in size as shown in Table 5 (packed height, 250 mm). An $NF_3$ gas containing $N_2F_2$ diluted with He gas of the same volume as that of the $NF_3$ gas as shown in Examples 4–6 was passed through the packed column under the conditions shown in Table 5.

The $NF_3$ gas after passing through the column was bubbled through a 1% by weight aqueous KI in a way similar to Examples 4–6, and then led to a collecting bomb cooled with liquid nitrogen to liquefy and collect $NF_3$ in a manner similar to Examples 4–6. After stopping the passing of the $NF_3$ gas, the $NF_3$ collecting bomb was vacuum-evacuated to remove He gas.

The composition of $NF_3$ gas before passing the column and that after passing the column and in the collecting bomb were analyzed by gas chromatography. The results are as shown in Table 5. It is noted that $N_2F_2$ was removed, but the yield of the important $NF_3$ was lowered. That is, in the above examples the rate of $NF_3$ loss was as low as about 1.0–2.8% while in the comparison examples 5–8, the rate of $NF_3$ loss was surprisingly very high such as 7.5–21%. This is a big problem.

In the same way, after continuous use for one week, the state of the inner wall of the reaction vessel was observed. And it was found that a brittle metal fluoride film formed on the inner wall was broken all over the inner wall and peeled off and the metal surface was severely damaged though the degree of damage varied somewhat depending on the type of metal such as iron, copper, stainless steel and nickel. The metal pieces were also in a state similar to the above and moreover, broken pieces of the peeled film were accumulated in the packed bed in a fairly large amount.

Therefore, the concern was that the accumulation of the pieces in the packed bed would increase and the peeled film broken pieces that were conveyed by the gas in a large amount to and mixed with the down stream line would clog the line if the continuous operation was carried out anymore.

In addition, there was danger that the wall of the reaction vessel was further corroded and becoming thinner thus resulting in forming holes and blowing the gases therethrough, and therefore, any further continuous operation was given up.

REFERENCE EXAMPLE 2

A stainless steel column of 10 mm in inner diameter and 300 mm long was packed with commercially available zeolite (pore size: 5 Å) (24–48 mesh particles) resulting in a packed bed of 250 mm thick, and the $NF_3$ gas, free of $N_2F_2$ prepared in Example 6 was passed through the zolite layer. With respect to the gas passing conditions, the temperature was room temperature (about 20° C.), the flow rate of $NF_3$ gas 20 Nml/min., and the gas passing pressure 760 Torr.

After passing through the column, the composition of $NF_3$ gas was analyzed by gas chromatography. As a result, the contents of impurities were very low, that is, $N_2F_2$ 10 ppm or less, $N_2O$ 10 ppm or less, and $CO_2$ 10 ppm or less. Therefore, it is realized that when $NF_3$ gas from which $N_2F_2$ was previously removed according to the present invention is purified with a known adsorbent, impurities other than $N_2F_2$ such as $N_2O$, $CO_2$ and the like can be removed at a very high removing rate and a highly pure $NF_3$ can be obtained.

TABLE 3

| | Example No. | | |
|---|---|---|---|
| | 4 | 5 | 6 |
| Gas passing conditions | | | |
| Gas passing temperature (°C.) | 170 | 300 | 600 |
| Flow rate of $NF_3$ gas diluted with He gas (Nml/min.) | 60 | 60 | 60 |
| Gas passing pressure (torr) | 760 | 760 | 760 |
| Gas passing time (h) | 4 | 4 | 4 |
| Before gas passing Gas analysis | | | |
| He (%) | 48.5 | 48.5 | 48.5 |
| $N_2$ (%) | 0.4 | 0.4 | 0.4 |
| $NF_3$ (%) | 47.3 | 47.3 | 47.3 |
| $N_2F_2$ (%) | 1.9 | 1.9 | 1.9 |
| $NF_3$ pure amount (g) | 21.6 | 21.6 | 21.6 |
| After gas passing Gas analysis | | | |
| $N_2$ (%) | 1.8 | 2.0 | 2.0 |
| $NF_3$ (%) | 96.4 | 96.6 | 96.6 |
| $N_2F_2$ (ppm) | 20 | 10 or less | 10 or less |
| $NF_3$ pure amount (g) | 21.4 | 21.3 | 21.0 |
| Rate of $NF_3$ loss (%) | 1.0 | 1.4 | 2.8 |

TABLE 4

| | Example No. | | |
|---|---|---|---|
| | 7 | 8 | 9 |
| Gas passing conditions | | | |
| Packed solid fluoride | $AlF_3$ | NaF | $Na_3AlF_6$ |
| Gas passing temperature (°C.) | 300 | 300 | 300 |
| Flow rate of $NF_3$ gas diluted with He gas (Nml/min.) | 60 | 60 | 60 |
| Gas passing pressure (torr) | 760 | 760 | 760 |
| Gas passing time (h) | 4 | 4 | 4 |
| Before gas passing Gas analysis | | | |
| He (%) | 48.5 | 48.5 | 48.5 |
| $N_2$ (%) | 0.4 | 0.4 | 0.4 |
| $NF_3$ (%) | 47.3 | 47.3 | 47.3 |
| $N_2F_2$ (%) | 1.9 | 1.9 | 1.9 |
| $NF_3$ pure amount (g) | 21.6 | 21.6 | 21.6 |
| After gas passing Gas analysis | | | |
| $N_2$ (%) | 2.0 | 2.0 | 2.0 |
| $NF_3$ (%) | 96.6 | 96.6 | 96.7 |

TABLE 4-continued

| | Example No. | | |
|---|---|---|---|
| | 7 | 8 | 9 |
| $N_2F_2$ (ppm) | 10 or less | 10 or less | 10 or less |
| $NF_3$ pure amount (g) | 21.3 | 21.4 | 21.3 |
| Rate of $NF_3$ loss (%) | 1.4 | 1.0 | 1.4 |

TABLE 5

| | Comparison Example No. | | | |
|---|---|---|---|---|
| | 5 | 6 | 7 | 8 |
| Gas passing conditions | | | | |
| Material of column | Stainless steel | Stainless steel | Nickel | Nickel |
| Packing of metal piece or packing | Iron | Aluminum | Nickel | NaF |
| Gas passing temperature (°C.) | 300 | 300 | 300 | 300 |
| Flow rate of $NF_3$ gas diluted with He gas (Nml/min.) | 60 | 60 | 60 | 60 |
| Gas passing pressure (torr) | 760 | 760 | 760 | 760 |
| Gas passing time (h) | 4 | 4 | 4 | 4 |
| Before gas passing Gas analysis | | | | |
| He (%) | 48.5 | 48.5 | 48.5 | 48.5 |
| $N_2$ (%) | 0.4 | 0.4 | 0.4 | 0.4 |
| $NF_3$ (%) | 47.3 | 47.3 | 47.3 | 47.3 |
| $N_2F_2$ (%) | 1.9 | 1.9 | 1.9 | 1.9 |
| $NF_3$ pure amount (g) | 21.6 | 21.6 | 21.6 | 21.6 |
| After gas passing Gas analysis | | | | |
| $N_2$ (%) | 5.4 | 5.2 | 4.5 | 3.5 |
| $NF_3$ (%) | 93.4 | 93.6 | 94.0 | 95.0 |
| $N_2F_2$ (ppm) | 10 or less | 10 or less | 10 or less | 10 or less |
| $NF_3$ pure amount (g) | 17.0 | 17.0 | 17.4 | 20.0 |
| Rate of $NF_3$ loss (%) | 21 | 21 | 19 | 7.5 |

INDUSTRIAL APPLICABILITY

The present invention is concerned with a method for removing $N_2F_2$ contained in $NF_3$ gas. The method is a very simple and economical method which comprises heating the $NF_3$ gas at specified temperatures in a vessel having an inner wall coated with a strong and passive film of nickel fluoride, or heating the $NF_3$ gas at specified temperatures in a packed bed prepared by packing the vessel with a solid fluoride. In the above, when the vessel is packed with a solid fluoride, $N_2F_2$ is removed better than when heated simply in the empty vessel.

As shown in the working examples, $N_2F_2$ is removed at a high rate so that, when the $NF_3$ gas purified by the method of the present invention is purified again by a known purification method, for example, using an adsorbent such as zeolites as mentioned in the text and examples, the present invention produces a remarkable function and effect in that a highly pure $NF_3$ gas suitable for materials for a semiconductor dry etching agent or the like as illustrated in Reference Example 1 and Reference Example 2 can be easily obtained.

In addition, the method of the present invention can produce purified $NF_3$ gas with little loss of $NF_3$ and in good yield, and further, the continuous purification operation can be safely carried out for a long period of time so that this invention's industrial applicability is of great value.

We claim:

1. A method for purifying nitrogen trifluoride gas containing at least dinitrogen difluoride as impurities which comprises:
   a. providing a vessel at least the inner wall of which is composed of nickel;
   b. then forming a film of nickel fluoride by bringing at least fluorine gas into contact with for 10 minutes to 15 hours with the nickel inner wall of the vessel, the vessel being heated to about 30° to 200° C., said at least fluorine gas contacting the nickel inner wall first having a low $F_2$ gas concentration and then being enhanced to finally having a 100 percent content of $F_2$ gas;
   c. then heating the nitrogen trifluoride gas at 150° to 600° C. in the vessel the nickel inner wall of which is covered with the nickel fluoride film; and
   d. then heating the nickel fluoride film at 400° to 800° C. in an inert atmosphere.

2. The method according to claim 1 in which the thickness of the nickel fluoride film ranges from 10 to 100 μm.

3. The method according to claim 1 in which the vessel is a cylindrical vessel.

4. The method according to claim 1 in which the fluorine gas is brought into contact with the inner wall of the vessel at 30°–200° C.

5. The method according to claim 1 in which the nickel fluoride film produced by bringing fluorine gas into contact with the inner wall of the vessel is further heated in an inert gas atmosphere.

6. The method according to claim 5 in which the heating is effected at 400°–800° C. in an inert gas atmosphere.

7. A method for purifying nitrogen trifluoride gas containing at least dinitrogen difluoride as impurities which comprises:
   a. providing a vessel at least the inner wall of which is composed of nickel;
   b. then forming a film of nickel fluoride by bringing at least fluorine gas into contact for 10 minutes to 15 hours with the nickel inner wall of the vessel, the vessel being heated to about 30° to 200° C., said at least fluorine gas contacting the nickel inner wall first having a low $F_2$ gas concentration and then being enhanced to finally having a 100 percent content of $F_2$ gas;
   c. then packing the vessel with a solid fluoride, the nickel inner wall of the vessel being covered with the nickel fluoride film, to form a packed bed;
   d. then heating the nitrogen trifluoride gas in the packed bed at 150° to 600° C., and
   e. then heating the nickel fluoride film at 400° to 800° C. in an inert atmosphere.

8. The method according to claim 7 in which the thickness of the nickel fluoride film ranges from 10 to 100 μm.

9. The method according to claim 7 in which the vessel is a cylindrical vessel.

10. The method according to claim 7 in which the fluorine gas is brought into contact with the inner wall of the vessel at 30°–200° C.

11. The method according to claim 7 in which the nickel fluoride film produced by bringing fluorine gas into contact with the inner wall of the vessel is further heated in an inert gas atmosphere.

12. The method according to claim 11 in which the heating is effected at 400°–800° C. in an inert gas atmosphere.

13. The method according to claim 7 in which the solid fluoride is at least one member selected from the group consisting of fluorides of metals of group IA, fluorides of metals of group IIA, fluorides of metals of group IIIA of the Periodic Table, double salts thereof, and mixtures thereof.

14. The method according to claim 13 in which the solid fluoride is at least one member selected from the group consisting of lithium fluoride (LiF), sodium fluoride (NaF), potassium fluoride (KF), rubidium fluoride (RbF), cesium fluoride (CsF), beryllium fluoride ($BeF_2$), magnesium fluoride ($MgF_2$), calcium fluoride ($CaF_2$), strontium fluoride $SrF_2$), barium fluoride ($BaF_2$), aluminum fluoride ($AlF_3$), gallium fluoride ($GaF_3$), indium fluoride ($InF_3$), and aluminum sodium fluoride ($Na_3AlF_6$).

* * * * *